United States Patent
Park et al.

(10) Patent No.: US 9,887,691 B2
(45) Date of Patent: Feb. 6, 2018

(54) PERIODIC SIGNAL GENERATION CIRCUIT AND SEMICONDUCTOR SYSTEM INCLUDING THE SAME

(71) Applicant: SK hynix Inc., Icheon-si, Gyeonggi-do (KR)

(72) Inventors: Myeong Jae Park, Icheon-si (JP); Kyung Hoon Kim, Seoul (KR); Woo Yeol Shin, Seoul (KR); Han Kyu Chi, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/634,646

(22) Filed: Jun. 27, 2017

(65) Prior Publication Data

US 2017/0294899 A1  Oct. 12, 2017

Related U.S. Application Data

(62) Division of application No. 14/878,922, filed on Oct. 8, 2015, now Pat. No. 9,722,583.

(30) Foreign Application Priority Data

Aug. 20, 2015  (KR) ........................ 10-2015-0117458

(51) Int. Cl.
  *H03K 3/03*  (2006.01)
  *H03K 5/13*  (2014.01)
  *H03K 3/014*  (2006.01)

(52) U.S. Cl.
  CPC .......... *H03K 3/0315* (2013.01); *H03K 3/014* (2013.01); *H03K 5/13* (2013.01)

(58) Field of Classification Search
  CPC  H03K 3/00; H03K 3/014; H03K 3/03; H03K 3/0315; H03K 5/13
  USPC ................................ 327/165, 166, 291, 299
  See application file for complete search history.

(56) References Cited

U.S. PATENT DOCUMENTS

| | | |
|---|---|---|
| 5,233,314 A | 8/1993 | McDermott et al. |
| 5,534,826 A | 7/1996 | Logan |
| 2004/0135601 A1 | 7/2004 | Aman |
| 2007/0002657 A1 | 1/2007 | Shim |
| 2010/0134169 A1 | 6/2010 | Okubo |
| 2012/0086490 A1* | 4/2012 | Doo ................ H03K 19/00361 327/291 |
| 2016/0232982 A1 | 8/2016 | Ito |

FOREIGN PATENT DOCUMENTS

KR  1020140096598 A  8/2014

* cited by examiner

*Primary Examiner* — William Hernandez
(74) *Attorney, Agent, or Firm* — William Park & Associates Ltd.

(57) ABSTRACT

A semiconductor system may include a first semiconductor device configured to output a command and receive data. The semiconductor system may include a second semiconductor device configured to generate a period signal, the period signals periodically toggled in response to the command, output the data in response to the period signal, and discharge the charges of an internal node if the period signal is not toggled during a predetermined section.

12 Claims, 9 Drawing Sheets

PERIODIC SIGNAL GENERATION CIRCUIT AND SEMICONDUCTOR SYSTEM INCLUDING THE SAME

CROSS-REFERENCE TO RELATED APPLICATION

The present application claims priority under 35 U.S.C. § 119(a) to Korean application number 10-2015-0117458, filed on Aug. 20, 2015, in the Korean Intellectual Property Office, which is incorporated herein by reference in its entirety.

BACKGROUND

1. Technical Field

Embodiments of the present disclosure generally relate to a period signal generation circuit capable of generating a period signal that may be periodically toggled and a semiconductor system including the same.

2. Related Art

In order to control an internal operation, of a semiconductor device, the semiconductor device requires a period signal. Accordingly, the semiconductor device internally generates the period signal or receives the period signal from the outside and uses the period signal to perform the internal operation. The period signal may be used by the semiconductor device to perform a repetitive internal operation because is the period signal may be toggled in a constant cycle.

A period signal generation circuit for generating such a period signal may be implemented using a known ring oscillator.

The known ring oscillator includes odd-numbered inverters, to receive a period signal that is fed back, and to generate a period signal that is periodically toggled.

Furthermore, a semiconductor device checks whether a failure has occurred by detecting the period of a period signal in order to check the failure occurring depending on a change of a process, voltage, and temperature during fabrication. Whether the toggling period of the period signal is within a set range is detected in order to determine whether a failure has occurred in the semiconductor device. If the toggling period of the period signal is out of the set range, then the semiconductor device is checked to determine whether or not a failure has occurred.

The period signal generation circuit for generating the period signal as described above may be included inside or outside the semiconductor device.

SUMMARY

In an embodiment, a semiconductor system may be provided. The semiconductor system may include a first semiconductor device configured to output a command and receive data. The semiconductor system may include a second semiconductor device configured to generate a period signal, the period signal periodically toggled in response to the command, output the data in response to the period signal, and discharge the charges of an internal node if the period signal is not toggled during a predetermined section.

In an embodiment, a period signal generation circuit may be provided. The period signal generation circuit may include an oscillator configured to generate a period signal toggled based on the amount of charges of an internal node in response to an enable signal and discharge the charges of the internal node in response to a reset signal. The period signal generation circuit may include a detection signal generation unit configured to detect the toggling period of the period signal and generate a detection signal. The detection signal may be enabled if the period signal is not toggled during a predetermined section. The period signal generation circuit may include a reset signal generation unit configured to generate and enable the reset signal enabled in response to the detection signal.

In an embodiment, a period signal generation circuit may be provided. The period signal generation circuit may include an oscillator configured to generate a period signal toggled based on an amount of charge of an internal node of the oscillator. The period signal generation circuit may include a detection signal generation unit configured to detect a toggling period of the period signal. If the period signal does not toggle during a predetermined section the oscillator is configured to discharge the internal node.

DETAILED DESCRIPTION

Hereinafter, a period signal generation circuit and a semiconductor system including the same will be described below with reference to the accompanying drawings through various examples of embodiments.

Various embodiments may be directed to the provision of a period signal generation circuit configured to generate a toggled period signal by discharging the charges of an internal node if a period signal generated by an oscillator is not toggled during a predetermined section and a semiconductor system including the same.

Figure 1:
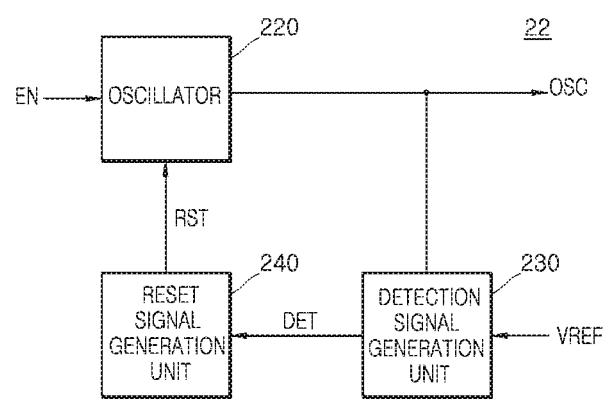
FIG. 1 is a block diagram illustrating a representation of an example of the configuration of a period signal generation circuit in accordance with an embodiment.

Referring to FIG. 1, a period signal generation circuit 22 in accordance with an embodiment may include an oscillator 220, a detection signal generation unit 230, and a reset signal generation unit 240.

The oscillator 220 may generate a period signal OSC that is periodically toggled based on the amount of charges of an internal node (nd21 of FIG. 2) in response to an enable signal EN. The oscillator 220 may discharge the charges of the internal node (nd21 of FIG. 2) in response to a reset signal RST. In an embodiment, the oscillator 220 may be implemented using any suitable type of ring oscillator.

The detection signal generation unit 230 may detect the toggling period of the period signal OSC and may generate a detection signal DET if the period signal OSC is not toggled during a predetermined section. An operation for generating the detection signal DET is described below in connection with elements that are described later.

The reset signal generation unit 240 may generate the reset signal RST. The reset signal RST may be enabled in response to the detection signal DET. In an embodiment, the reset signal generation unit 240 may be implemented using any suitable type of pulse signal generation circuit configured to generate a pulse generated for a specific section in response to the detection signal DET. In an embodiment, the reset signal generation unit 240 may be implemented using any suitable type comparator configured to generate the reset signal RST enabled when the level of the detection signal DET is higher than the level of a reference voltage VREF. In an embodiment, the reset signal generation unit 240 may be implemented using any suitable type driver configured to generate the reset signal RST enabled in response to the detection signal DET. In an embodiment, the reset signal RST may be set as a signal that is enabled when the level of the detection signal DET reaches a target level. The target level of the detection signal DET is described below with reference to drawings to be described later.

The period signal generation circuit 22 may generate the period signal OSC. The period signal OSC may be periodically toggled in response to the enable signal EN. The period signal generation circuit 22 may generate the period signal OSC which is toggled by discharging the charges of the internal node (nd21 of FIG. 2) if the period signal OSC is not toggled during a predetermined section. An example in which the period signal OSC is not toggled during a predetermined section is described below in connection with elements to be described later.

Figure 2:
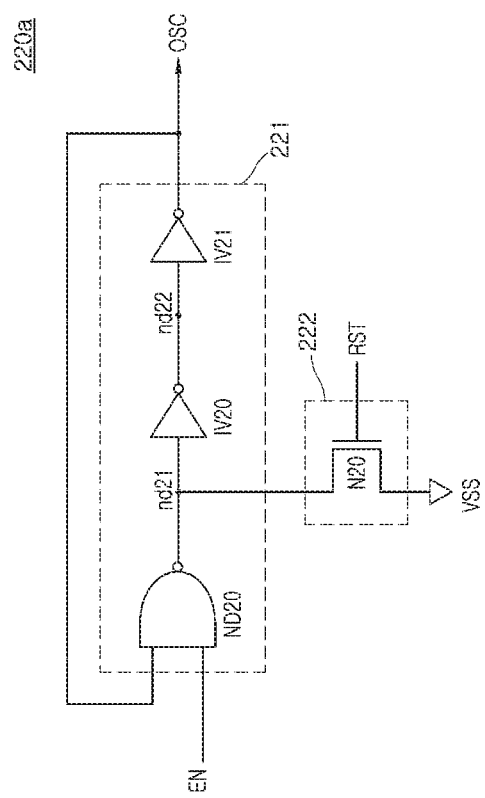
FIG. 2 is a circuit diagram illustrating a representation of an example of an oscillator included in the period signal generation circuit of FIG. 1.

Referring to FIG. 2, an oscillator 220a in accordance with an embodiment may include a first buffer unit 221 and a first charge discharge unit 222.

The first buffer unit 221 may include a first logic element ND20 implemented using, for example but not limited to, a NAND gate. The first logic element ND20 may be configured to invert and buffer the period signal OSC when the enable signal EN is enabled and to output the inverted and buffered signal to the internal node nd21. The first buffer unit 221 may include a second logic element IV20 implemented using, for example but not limited to, an inverter. The first buffer unit 221 may be configured to invert and buffer the signal of the internal node nd21 and to output the inverted and buffered signal to an internal node nd22. The first buffer unit 221 may include a third logic element IV21 implemented using, for example but not limited to, an inverter. The third logic element IV21 may be configured to generate the period signal OSC by inverting and buffering the signal of the internal node nd22. The first logic element ND20, second logic element IV20, and third logic element IV21 of the first buffer unit 221 may be coupled in series. In an embodiment, the oscillator 220a may be implemented using a ring oscillator configured to receive the period signal OSC that is fed back.

In an embodiment, the first buffer unit 221 may generate the period signal OSC which is toggled when the enable signal EN is enabled.

The first charge discharge unit 222 may be implemented using, for example but not limited to, an NMOS transistor N20. The first charge discharge unit 222 may be electrically coupled between the internal node nd21 and a terminal for a ground voltage VSS. The first charge discharge unit 222 may be turned on in response to the reset signal RST.

For example, the NMOS transistor N20 of the first charge discharge unit 222 may be turned on when the reset signal RST is enabled to a logic high level, so the charges of the internal node nd21 may be discharged to the terminal for the ground voltage VSS.

Figure 3:
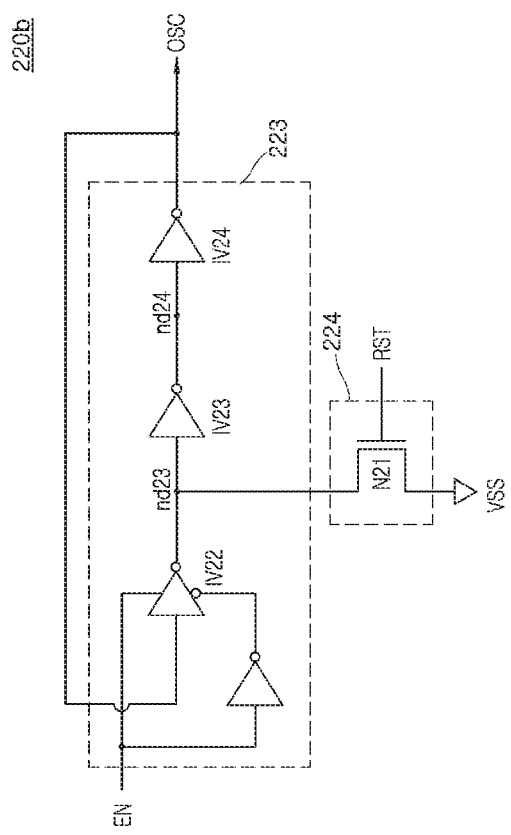
FIG. 3 is a circuit diagram illustrating a representation of an example of an oscillator included in the period signal generation circuit in accordance with an embodiment.

Referring to FIG. 3, an oscillator 220b in accordance with an embodiment may include a second buffer unit 223 and a second charge discharge unit 224.

The second buffer unit 223 may include a fourth logic element IV22. The fourth logic element IV22 may be implemented using, for example but not limited to, an inverter. The inverter may be turned on when the enable signal EN is enabled. The fourth logic element IV22 may be configured to invert and buffer the period signal OSC and to output the inverted and buffered signal to an internal node nd23. The second buffer unit 223 may include a fifth logic element IV23. The fifth logic element IV23, may be implemented using, for example but not limited to, an inverter. The fifth logic element IV23 may be configured to invert and buffer the signal of the internal node nd23 and to output the inverted and buffered signal to an internal node nd24. The second buffer unit 223 may include a sixth logic element IV24. The sixth logic element IV24 may be implemented using, for example but not limited to, an inverter. The sixth logic element IV24 may be configured to generate the period signal OSC by inverting and buffering the signal of the internal node nd24. The fourth logic element IV22, fifth logic element IV23, and sixth logic element IV24 of the second buffer unit 223 may be coupled in series. In an embodiment, the oscillator 220b may be implemented using a ring oscillator configured to receive the period signal OSC that is fed back. In an embodiment, the fourth logic element IV22 may be implemented using a three-phase inverter turned on when the enable signal EN is enabled to a logic high level. The enable signal EN may be enabled in order to generate the period signal OSC that is periodically toggled.

The second buffer unit 223 may generate the period signal OSC which is toggled when the enable signal EN is enabled.

The second charge discharge unit 224 may be implemented using, for example but not limited to, an NMOS transistor N21. The second charge discharge unit 224 may be electrically coupled between the internal node nd23 and a terminal for a ground voltage VSS. The second charge discharge unit 224 may be turned on in response to the reset signal RST.

For example, when the reset signal RST is enabled to a logic high level, the NMOS transistor N21 of the second charge discharge unit 224 may be turned on and may discharge the charges of the internal node nd23 to the terminal for the ground voltage VSS.

Figure 4:
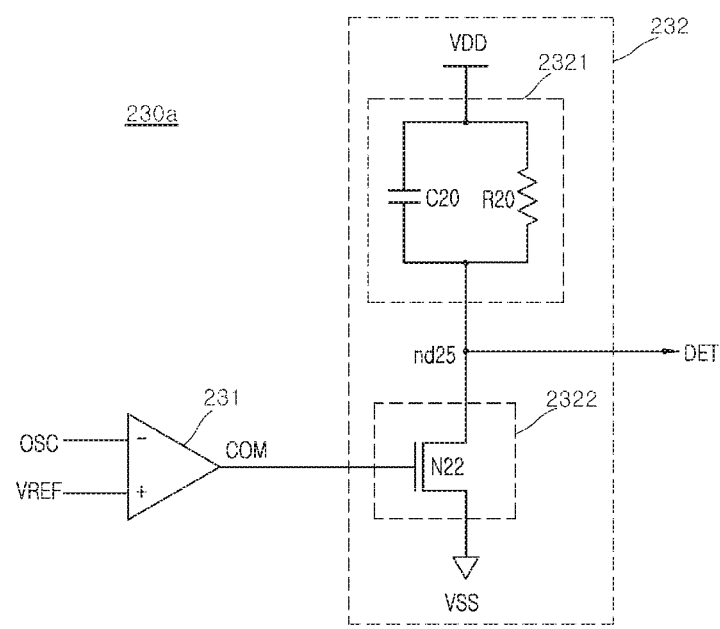
FIG. 4 is a circuit diagram illustrating a representation of an example of a detection signal generation unit included in the period signal generation circuit of FIG. 1.

Referring to FIG. 4, a detection signal generation unit 230a in accordance with an embodiment may include a first comparison unit 231 and a first detection signal output unit 232. The first detection signal output unit 232 may include a first charge supply unit 2321 and a third charge discharge unit 2322.

The first comparison unit 231 may compare the period signal OSC with the reference voltage VREF and may generate a comparison signal COM. The comparison signal COM may be enabled to a logic high level if, for example, a level of the reference voltage VREF is higher than a level of the period signal OSC. In an embodiment, the first comparison unit 231 may be implemented using any suitable type of comparator.

The first charge supply unit 2321 may include a capacitor C20 electrically coupled between a terminal for a power supply voltage VDD and an internal node nd25 and a resistor R20 electrically coupled between the terminal for the power supply voltage VDD and the internal node nd25 and coupled in parallel to the capacitor C20.

The first charge supply unit 2321 may supply charges from the terminal for the power supply voltage VDD to the internal node nd25 based on an internal resistance value set by the capacitor C20 and the resistor R20.

For example, in the first charge supply unit 2321, speed at which charges are supplied from the terminal for the power supply voltage VDD to the internal node nd25 may be controlled based on an internal resistance value set by the capacitor C20 and the resistor R20.

The third charge discharge unit 2322 may be implemented using an NMOS transistor N22 electrically coupled between the internal node nd25 and a terminal for a ground voltage VSS and turned on in response to the comparison signal COM.

For example, the NMOS transistor N22 of the third charge discharge unit 2322 may be turned on when the comparison signal COM is enabled to a logic high level, so the charges of the internal node nd25 may be discharged to the terminal for the ground voltage VSS.

Figure 5:
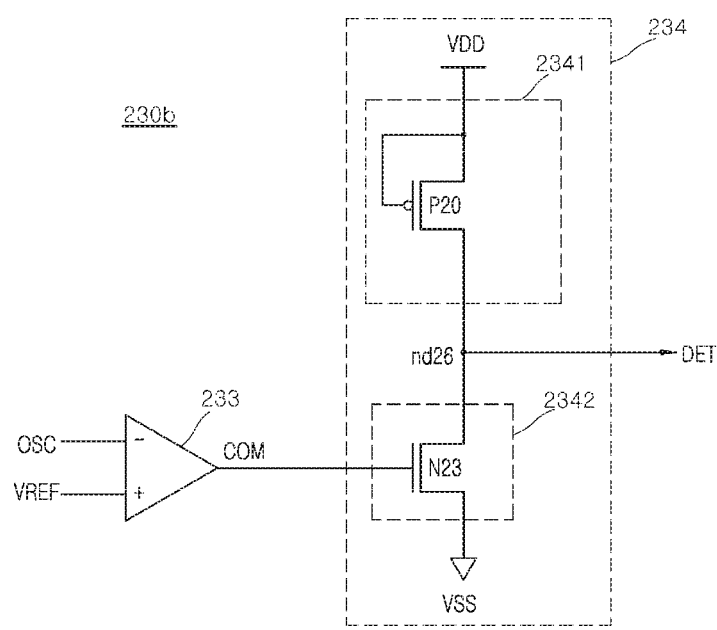
FIG. 5 is a circuit diagram illustrating a representation of an example of a detection signal generation unit included in the period signal generation circuit in accordance with an embodiment.

Referring to FIG. 5, a detection signal generation unit 230b in accordance with an embodiment may include a second comparison unit 233 and a second detection signal output unit 234. The second detection signal output unit 234 may include a second charge supply unit 2341 and a fourth charge discharge unit 2342.

The second comparison unit 233 may compare the period signal OSC with the reference voltage VREF and may generate a comparison signal COM. The comparison signal COM may be enabled to a logic high level, for example, if a level of the reference voltage VREF is higher than a level of the period signal OSC. In an embodiment, the second comparison unit 233 may be implemented using any suitable type comparator.

The second charge supply unit 2341 may be implemented using a PMOS transistor P20 configured to have a source coupled to a terminal for a power supply voltage VDD, a drain coupled to an internal node nd26, a gate to which the power supply voltage VDD is input and to supply charges to the internal node nd26 based on an internal resistance value.

The second charge supply unit 2341 may supply charges, corresponding to the amount of current flowing in the cut-off region of the PMOS transistor P20, from the terminal for the power supply voltage VDD to the internal node nd26. In this example, the amount of current flowing in the cut-off region may be set as the leakage current of the PMOS transistor P20. Furthermore, the second charge supply unit 2341 may control the amount of the leakage current based on an internal resistance value in the cut-off region of the PMOS transistor P20.

For example, in the second charge supply unit 2341, speed at which charges are supplied from the terminal for the power supply voltage VDD to the internal node nd26 may be controlled based on an internal resistance value set in the cut-off region of the PMOS transistor P20.

The fourth charge discharge unit 2342 may be implemented using an NMOS transistor N23 electrically coupled between the internal node nd26 and a terminal for a ground voltage VSS and turned on in response to the comparison signal COM.

For example, the NMOS transistor N23 of the fourth charge discharge unit 2342 may be turned on when the comparison signal COM is enabled to a logic high level, so that the charges of the internal node nd26 may be discharged to the terminal for the ground voltage VSS.

Figure 6:
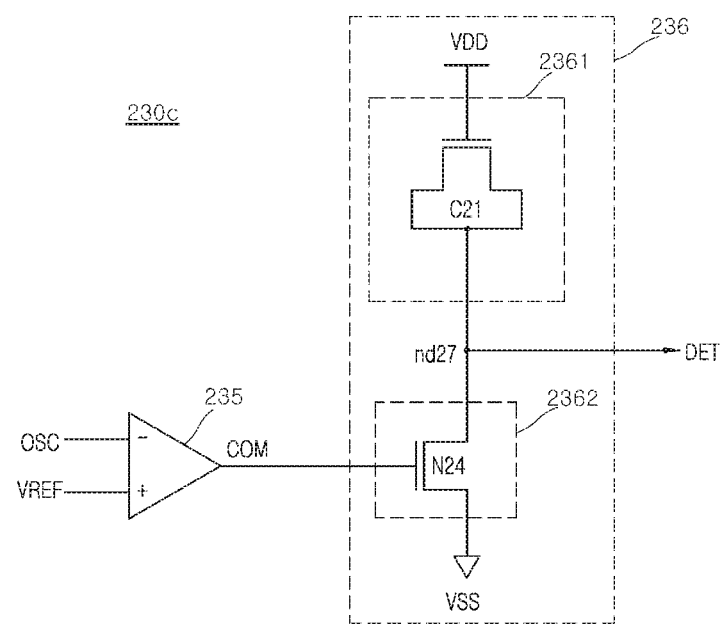
FIG. 6 is a circuit diagram illustrating a representation of an example of a detection signal generation unit included in the period signal generation circuit in accordance with an embodiment.

Referring to FIG. 6, a detection signal generation unit 230c in accordance with an embodiment may include a third comparison unit 235 and a third detection signal output unit 236. The third detection signal output unit 236 may include a third charge supply unit 2361 and a fifth charge discharge unit 2362.

The third comparison unit 235 may compare the period signal OSC with the reference voltage VREF and may generate a comparison signal COM. The comparison signal COM may be enabled to a logic high level if, for example, a level of the reference voltage VREF is higher than a level of the period signal OSC. In an embodiment, the third comparison unit 235 may be implemented using any suitable type of comparator.

The third charge supply unit 2361 may be implemented using an NMOS transistor C21 configured to have a gate coupled to a terminal for a power supply voltage VDD and a source and drain coupled to an internal node nd27 and to supply charges from the terminal for the power supply voltage VDD to the internal node nd27 based on an internal resistance value set by a gate insulating film. The NMOS transistor C21 may be implemented using a capacitor having a source and a drain coupled.

For example, in the third charge supply unit 2361, speed at which charges are supplied from the terminal for the power supply voltage VDD to the internal node nd27 may be controlled based on an internal resistance value set by the gate insulating film of the NMOS transistor C21. In this example, the amount of charges supplied from the terminal for the power supply voltage VDD to the internal node nd27 may be set as a leakage current generated through the gate insulating film of the NMOS transistor C21.

The fifth charge discharge unit 2362 may be implemented using an NMOS transistor N24 electrically coupled between the internal node nd27 and a terminal for a ground voltage VSS and turned on in response to the comparison signal COM.

For example, the NMOS transistor N24 of the fifth charge discharge unit 2362 may be turned on when the comparison signal COM is enabled to a logic high level, so that the charges of the internal node nd27 may be discharged to the terminal for the ground voltage VSS.

Figure 7:
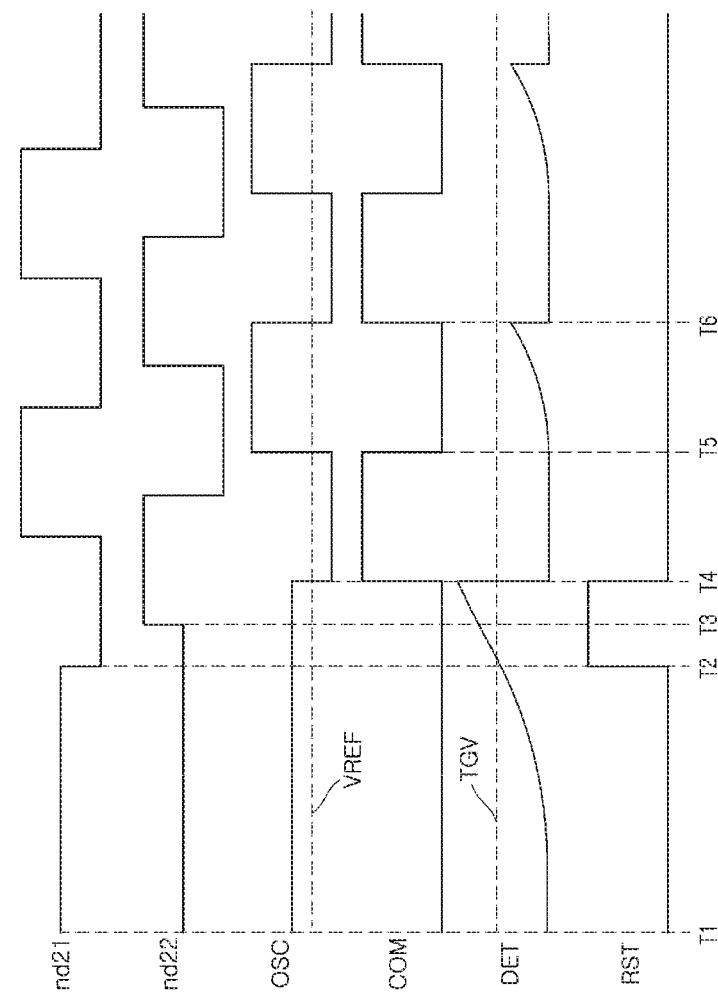
FIG. 7 is a timing diagram illustrating a representation of an example of an operation of the period signal generation circuit in accordance with an embodiment.

An operation of a semiconductor system configured as described above is described with reference to FIG. 7 by taking an example in which the period signal OSC is not toggled during a predetermined section. In this example, an operation of the period signal generation circuit 22 including the oscillator 220a of FIG. 2 and the detection signal generation unit 230a of FIG. 4 is described below as an example.

At a point of time T1, the levels of the internal nodes nd21 and nd22 of the oscillator 220a and the level of the period signal OSC are set to ½ of the level of the power supply voltage VDD. In this example, the levels of the internal nodes nd21 and nd22 and the period signal OSC are levels which may not change the levels of the output signals of the NAND gate ND20 and the inverters IV20 and IV21. That is, the internal nodes nd21 and nd22 and the period signal OSC are not toggled. At this time, the enable signal EN may be enabled to a logic high level.

The first comparison unit 231 of the detection signal generation unit 230a compares the period signal OSC with the reference voltage VREF and generates the comparison signal COM of a logic low level. In this example, a level of the reference voltage VREF may be set to be lower than that of the period signal OSC.

The first charge supply unit 2321 of the first detection signal output unit 232 supplies charges to the terminal for the power supply voltage VDD to the internal node nd25 based on an internal resistance value set by the capacitor C20 and the resistor R20, thereby generating the detection signal DET.

At this time, the third charge discharge unit 2322 receives the comparison signal COM of a logic low level and does not discharge the charges of the internal node nd25 to the terminal for the ground voltage VSS.

At a point of time T2, the first charge supply unit 2321 of the first detection signal output unit 232 generates the detection signal DET having a level raised by a target voltage TGV based on the amount of charges supplied from the terminal for the power supply voltage VDD to the internal node nd25 from the point of time T1. In this example, when the period signal OSC is not toggled during a predetermined section, such a section is a section before the detection signal DET reaches the target voltage TGV from the point of time T1.

At this time, the third charge discharge unit 2322 receives the comparison signal COM of a logic low level and does not discharge the charges of the internal node nd25 to the terminal for the ground voltage VSS.

The reset signal generation unit 240 receives the detection signal DET having a level of the target voltage TGV and generates the reset signal RST of a logic high level.

The first charge discharge unit 222 of the oscillator 220a receives the reset signal RST of a logic high level and discharges the charges of the internal node nd21 to the terminal for the ground voltage VSS.

At a point of time T3, the inverter IV20 of the first buffer unit 221 inverts and buffers the signal of the internal node nd21 and drives the internal node nd22 to a logic high level.

At a point of time T4, the inverter IV21 of the first buffer unit 221 inverts and buffers the signal of the internal node nd22 and generates the period signal OSC of a logic low level.

That is, the oscillator 220a generates the period signal OSC which is toggled.

The first comparison unit 231 of the detection signal generation unit 230a compares the period signal OSC with the reference voltage VREF and generates the comparison signal COM of a logic high level.

The third charge discharge unit 2322 receives the comparison signal COM of a logic high level and discharges the charges of the internal node nd25 to the terminal for the ground voltage VSS.

The reset signal generation unit 240 receives the detection signal DET having a level of the ground voltage VSS and generates the reset signal RST of a logic low level.

At a point of time T5, the first comparison unit 231 of the detection signal generation unit 230a compares the period signal OSC with the reference voltage VREF and generates the comparison signal COM of a logic low level.

The first charge supply unit 2321 of the first detection signal output unit 232 supplies charges from the terminal for the power supply voltage VDD to the internal node nd25 based on an internal resistance value set by the capacitor C20 and the resistor R20, thereby generating the detection signal DET.

At this time, the third charge discharge unit 2322 receivers the comparison signal COM of a logic low level and does not discharge the charges of the internal node nd25 to the terminal for the ground voltage VSS.

At a point of time T6, the first comparison unit 231 of the detection signal generation unit 230a compares the period signal OSC with the reference voltage VREF and generates the comparison signal COM of a logic high level.

The third charge discharge unit 2322 of the first detection signal output unit 232 receives the comparison signal COM of a logic high level and discharges the charges of the internal node nd25 to the terminal for the ground voltage VSS.

At this time, a level of the detection signal DET is lower than that of the target voltage TGV.

The period signal generation circuit configured as described above may generate the period signal which is toggled by discharging the charges of the internal node if the period signal is not toggled during a predetermined section.

Figure 8:
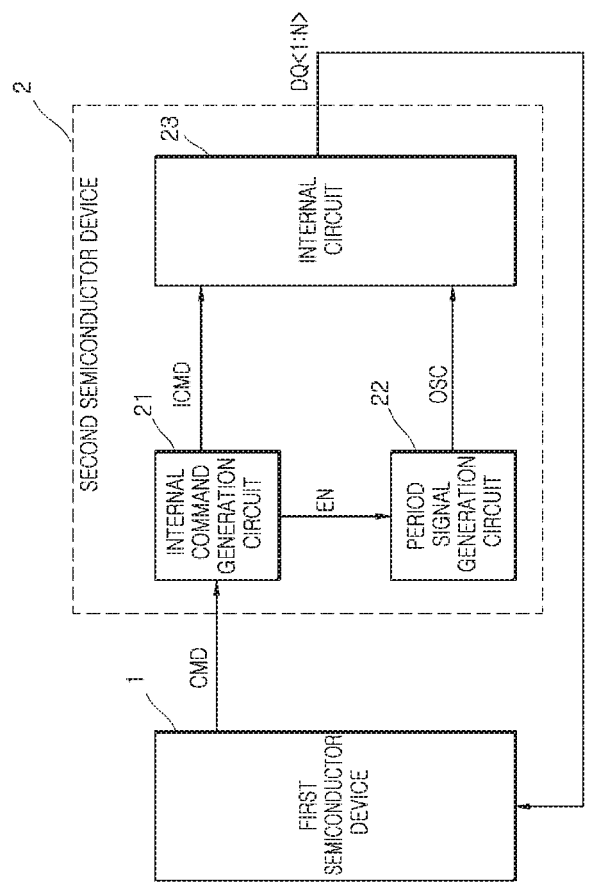
FIG. 8 is a block diagram illustrating a representation of an example of the configuration of a semiconductor system including the period signal generation circuit in accordance with an embodiment.

FIG. 8 is a block diagram illustrating the configuration of a semiconductor system including the period signal generation circuit in accordance with an embodiment.

Referring to FIG. 8, the semiconductor system including the period signal generation circuit in accordance with an embodiment may include a first semiconductor device 1 and a second semiconductor device 2. The second semiconductor device 2 may include an internal command generation circuit 21, a period signal generation circuit 22, and an internal circuit 23.

The period signal generation circuit 22 of FIG. 8 may be implemented using the period signal generation circuit of FIG. 1.

The first semiconductor device 1 may output a command CMD and receive data DQ<1:N>. The number of commands CMD has been illustrated as being one, but the command CMD may be generated so that it includes a plurality of bits and may be transmitted through lines through which at least one of an address, command, and data is transmitted. Furthermore, the command CMD may be consecutively transmitted through a single line. The data DQ<1:N> may be transmitted through a plurality of lines. The data DQ<1:N> may be transmitted through a single line. In some embodiments, the number of bits of the data DQ<1:N> may be set in various ways. In an embodiment N may be an integer greater than 1. The first semiconductor device 1 may be implemented using a controller configured to control the operation of the second semiconductor device 2 a test device configured to test the second semiconductor device 2.

The internal command generation circuit 21 may generate the enable signal EN and an internal command ICMD in response to the command CMD. In some embodiments, the internal command generation circuit 21 may be implemented to generate the enable signal EN and the internal command ICMD by decoding a plurality of the commands CMD. In this example, the enable signal EN may be set as a signal which is enabled when a refresh operation is performed or when an internal voltage, such as a high voltage and a low voltage, is generated through a pump circuit. The internal command ICMD may be set as one of commands for controlling the operation of the second semiconductor device 20.

The period signal generation circuit 22 may generate the period signal OSC which may be periodically toggled in response to the enable signal EN. If the period signal OSC is not toggled during a predetermined section, the period signal generation circuit 22 may generate the period signal OSC that is toggled by discharging the charges of the internal node (n21 of FIG. 2).

The internal circuit 23 may output the data DQ<1:N> in response to the internal command ICMD and the period signal OSC. For example, the internal circuit 23 may be implemented using a memory cell array configured to generate the data DQ<1:N> by performing a write operation and a read operation in response to the internal command ICMD and the period signal OSC. The internal circuit 23 may be implemented using a memory cell array configured to perform a refresh operation in response to the internal command ICMD and the period signal OSC. The internal circuit 23 may be implemented using a fuse array configured to generate the data DQ<1:N> depending on whether a fuse has been cut in response to the internal command ICMD and the period signal OSC. The internal circuit 23 may be implemented using an internal voltage generation circuit configured to generate a high voltage or a low voltage by performing a pumping operation in response to the internal command ICMD and the period signal OSC.

For example, the second semiconductor device 2 may generate the period signal OSC that may be periodically toggled in response to the command CMD and may output the data DQ<1:N> in response to the period signal OSC. If the period signal OSC is not toggled during a predetermined section, the second semiconductor device 2 may generate the period signal OSC which may be toggled by discharging the charges of the internal node (nd21 of FIG. 2).

The semiconductor system including the period signal generation circuit described with reference to FIGS. 1 to 8 may be applied to an electronic system, including a memory system, a graphic system, a computing system, and a mobile system. For example, referring to FIG. 9, an electronic system 1000 in accordance with an embodiment may include a data storage unit 1001, a memory controller 1002, buffer memory 1003, and an input and output interface 1004.

The data storage unit 1001 stores data applied by the memory controller 1002 in response to a control signal from the memory controller 1002, reads the stored data, and outputs the read data to the memory controller 1002. The data storage unit 1001 may include the second semiconductor device 2 of FIG. 8.

The data storage unit 1001 may include nonvolatile memory capable of continuing to store data without losing the data although power is off. The nonvolatile memory may be implemented using, for example but not limited to, flash memory (e.g., nor flash memory or NAND flash memory), phase change random access memory (PRAM), resistive random access memory (RRAM), spin transfer torque random access memory (STTRAM), and magnetic random access memory (MRAM).

Figure 9:
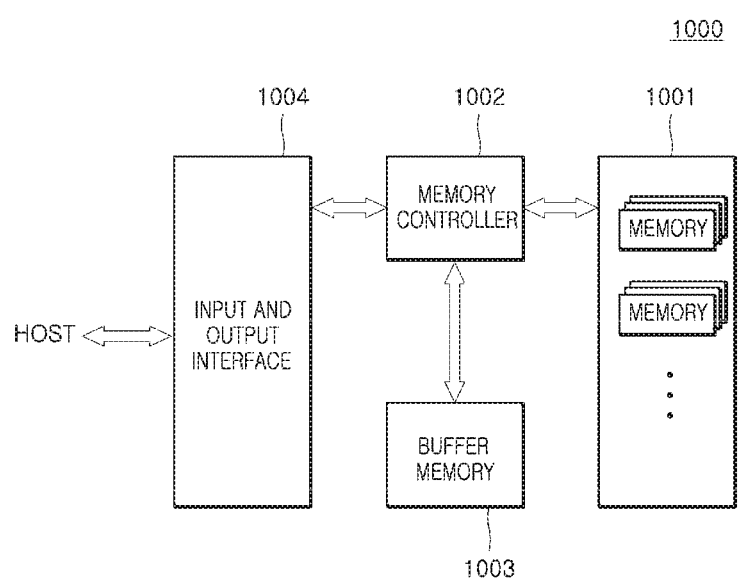
FIG. 9 is a diagram illustrating a representation of an example of an embodiment of the configuration of an electronic system to which the semiconductor system including the period signal generation circuit of FIGS. 1 to 8 has been applied.

The memory controller 1002 decodes a command applied by an external device (or a host device) through the input and output interface 1004 and controls the input and output of data for the data storage unit 1001 and the buffer memory 1003 based on a result of the decoding. The memory controller 1002 may include the first semiconductor device 1 of FIG. 8. In FIG. 9, the memory controller 1002 has been illustrated as being a single block. In some embodiments, regarding the memory controller 1002, a controller configured to control nonvolatile memory and a controller configured to control the buffer memory 1003 that is volatile memory may be independently configured.

The buffer memory 1003 may temporarily store data to be processed by the memory controller 1002, that is, data inputted to and output by the data storage unit 1001. The buffer memory 1003 may store data applied by the memory controller 1002 in response to the control signal. The buffer memory 1003 reads the stored data and outputs the read data to the memory controller 1002. The buffer memory 1003 may include volatile memory, such as, for example but not limited to, dynamic random access memory (DRAM), mobile DRAM, and static random access memory (SRAM).

The input/output interface 1004 provides physical connection between the memory controller 1002 and an external device (or host) so that the memory controller 1002 may receive a control signal for the input and output of data to and from the external device and may exchange data with the external device. The input/output interface 1004 may include one of various interface protocols, such as, for example but not limited to, a USB, MMC, PCI-E, SAS, SATA, PATA, SCSI, ESDI, and IDE.

The electronic system 1000 may be use as the auxiliary storage device or external storage device of a host device. The electronic system 1000 may include, for example but not limited to, a solid state disk (SSD), universal serial bus (USB) memory, a secure digital (SD) card, a mini-secure digital (mSD) card, a micro SD card, a secure digital high capacity (SDHC) card, a memory stick card, a smart media (SM) card, a multi media card (MMC), an embedded MMC (eMMC), and compact flash (CF).

In accordance with an embodiment, there may be an advantage in that the period signal that is toggled can be generated by discharging the charges of the internal node if the period signal generated by the oscillator is not toggled during a predetermined section.

Furthermore, in accordance with an embodiment, there may be an advantage in that an error in the operation can be prevented because the period signal that is toggled can be generated by discharging the charges of the internal node if the period signal generated by the oscillator is not toggled during a predetermined section and the internal circuit operates in response to the period signal.

While various embodiments have been described above, it will be understood to those skilled in the art that the embodiments described are by way of example only. Accordingly, the period signal generation circuit and the semiconductor system described herein should not be limited based on the described embodiments.

What is claimed is:

1. A semiconductor system, comprising:
    a first semiconductor device configured to output a command and receive data; and
    a second semiconductor device configured to generate a periodic signal, the periodic signal periodically toggled in response to the command, output the data in response to the periodic signal, and discharge charges of an internal node if the periodic signal is not toggled during a predetermined section.

2. The semiconductor system of claim 1, wherein the periodic signal is toggled because the charges of the internal node are discharged if the periodic signal is not toggled during the predetermined section.

3. The semiconductor system of claim 1, wherein the second semiconductor device comprises:

an internal command generation circuit configured to generate an enable signal, enabled in response to the command, and an internal command;
a periodic signal generation circuit configured to generate the periodic signal which is periodically toggled in response to the enable signal, detect a toggling periodic of the periodic signal, and discharge the charges of the internal node; and
an internal circuit driven in response to the internal command and the periodic signal and configured to output the data.

4. The semiconductor system of claim 3, wherein the periodic signal generation circuit comprises:
an oscillator configured to generate the periodic signal toggled based on an amount of charges of the internal node in response to the enable signal;
a detection signal generation unit configured to detect the toggling periodic of the periodic signal and generate a detection signal enabled if the periodic signal is not toggled during the predetermined section; and
a reset signal generation unit configured to generate a reset signal enabled in response to the detection signal.

5. The semiconductor system of claim 4, wherein the reset signal is enabled when a level of the detection signal is higher than a target level.

6. The semiconductor system of claim 4, wherein the oscillator comprises:
a buffer unit configured to generate the periodic signal toggled based on the amount of charges of the internal node in response to the enable signal and the periodic signal; and
a first charge discharge unit configured to discharge the charges of the internal node in response to the reset signal.

7. The semiconductor system of claim 6, wherein the buffer unit comprises:
a first logic element configured to invert and buffer the periodic signal in response to the enable signal and output the inverted and buffered signal to a first internal node;
a second logic element configured to invert and buffer the signal of the first internal node and output the inverted and buffered signal; and
a third logic element configured to generate the periodic signal by inverting and buffering the output signal of the second logic element.

8. The semiconductor system of claim 4, wherein the detection signal generation unit comprises:
a comparison unit configured to compare the periodic signal with a reference voltage and generate a comparison signal; and
a detection signal output unit configured to generate the detection signal having a level increased from a level of the ground voltage and generate the detection signal having the level of the ground voltage in response to the comparison signal.

9. The semiconductor system of claim 8, wherein the detection signal output unit comprises:
a charge supply unit disposed between a terminal for a power supply voltage and a second internal node and configured to supply charges from the terminal for the power supply voltage to the second internal node based on an internal resistance value; and
a second charge discharge unit electrically coupled between the second internal node and a terminal for the ground voltage and configured to discharge charges of the second internal node in response to the comparison signal.

10. The semiconductor system of claim 9, wherein the charge supply unit comprises:
a capacitor electrically coupled between the terminal for the power supply voltage and the second internal node; and
a resistor electrically coupled between the terminal for the power supply voltage and the second internal node and coupled to the capacitor in parallel.

11. The semiconductor system of claim 9, wherein the charge supply unit comprises a transistor configured to have a source coupled to the terminal for the power supply voltage, have a drain coupled to the second internal node, have a gate to which the power supply voltage is inputted, and supply the charges to the second internal node based on the internal resistance value.

12. The semiconductor system of claim 9, wherein the charge supply unit comprises a transistor configured to have a gate coupled to the terminal for the power supply voltage, have a source and a drain coupled to the second internal node, and supply the charges to the second internal node based on the internal resistance value set by an insulating film of the gate.

* * * * *